: (12) United States Patent
Siu et al.

(10) Patent No.: US 9,261,536 B2
(45) Date of Patent: Feb. 16, 2016

(54) TEST CONTACTOR FOR ELECTRICAL TESTING OF ELECTRONIC COMPONENTS

(75) Inventors: Hing Suen Siu, Kwai Chung (HK); Yu Sze Cheung, Kwai Chung (HK); Chi Wah Cheng, Tsing Yi (HK); Kai Fung Lau, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 604 days.

(21) Appl. No.: 13/584,971

(22) Filed: Aug. 14, 2012

(65) Prior Publication Data

US 2014/0049279 A1   Feb. 20, 2014

(51) Int. Cl.
    G01R 31/20    (2006.01)
    G01R 31/02    (2006.01)
    G01R 31/26    (2014.01)
    G01R 31/302   (2006.01)
    H01R 11/18    (2006.01)
    H01R 13/00    (2006.01)
    H05K 1/00     (2006.01)
    G01R 1/067    (2006.01)
    G01R 1/04     (2006.01)
    G01R 1/073    (2006.01)

(52) U.S. Cl.
    CPC .......... G01R 1/06772 (2013.01); G01R 1/0416 (2013.01); G01R 1/07342 (2013.01)

(58) Field of Classification Search
    CPC ...... G01R 31/20; G01R 1/0416; G01R 1/073; G01R 31/302; G01R 31/02; G01R 31/26; H01R 11/18; H01R 13/00; H05K 1/00; H05K 13/62

USPC ............ 324/754.03, 754.12, 754.13, 755.01, 324/762.01; 439/482, 912, 70–73, 331
    See application file for complete search history.

(56) References Cited

U.S. PATENT DOCUMENTS

| | | | | | |
|---|---|---|---|---|---|
| 4,028,812 | A | * | 6/1977 | Fieberg | G01L 5/0038 33/556 |
| 5,013,264 | A | * | 5/1991 | Tondreault | 439/636 |
| 5,035,629 | A | * | 7/1991 | Matsuoka | 439/70 |
| 5,743,749 | A | | 4/1998 | Kurakane | |
| 2005/0208840 | A1 | * | 9/2005 | Mancini et al. | 439/729 |
| 2009/0221165 | A1 | * | 9/2009 | Buck et al. | 439/108 |
| 2011/0241291 | A1 | * | 10/2011 | Nishinakama | B65H 3/0661 271/264 |
| 2013/0271170 | A1 | * | 10/2013 | Barabi | G01R 31/26 324/750.08 |

* cited by examiner

Primary Examiner — Patrick Assouad
Assistant Examiner — Lamarr Brown
(74) Attorney, Agent, or Firm — Ostrolenk Faber LLP

(57) ABSTRACT

A testing apparatus for electronic components comprises a mounting block and a plurality of contact strips arranged on the mounting block. The contact strips are configured such that electrical leads of an electronic component are operative to press against and bend the contact strips in a biasing direction to ensure good contact between the electrical leads and the contact strips during testing of the electronic component. Further, a preload block located on the mounting block is operative to contact and apply a pre-stress force onto the contact strips in the biasing direction prior to contact between the electrical leads and the contact strips.

7 Claims, 2 Drawing Sheets

TEST CONTACTOR FOR ELECTRICAL TESTING OF ELECTRONIC COMPONENTS

FIELD OF THE INVENTION

The invention relates to a tester for testing electronic components, and in particular to an electrical contactor for such tester.

BACKGROUND AND PRIOR ART

Conventionally, a contacting device comprises a plurality of contact strips, and a mounting block for mounting the contact strips. In order to perform testing on an electronic component, the component being tested is positioned onto the contact strips so that electrical leads of the component make electrical contact with the contact strips. Upon electrical contact being made, the electronic component is then generally driven further in the direction of the contact strips to bend the contact strips and to ensure that there is good contact between the electrical leads of the component and the contact strips.

This is because whether the electrical contact is good enough to ensure testing reliability is determined by the contact resistance between the electrical leads and the contact strips. For the purpose of ensuring that there is good contact, the contact pressure between the electrical leads on the electronic component and the contact strips has to be greater than a certain predetermined level, which level usually depends on the materials from which the electrical leads and contact strips are made of.

In turn, in order to create sufficient contact pressure, the electronic component is driven towards the contact strips for a certain distance so as to bend the contact strips. The bending force on the flexible contact strips will provide a reaction force on the electrical leads of the component, thereby creating the required contact pressure to ensure good contact.

FIG. 1 is an isometric view of contact strips 104 mounted on a mounting block 102 in a prior art test contactor 100. The contact strips 104 comprise elongated strips of electrically-conductive material which are centrally attached and mounted to a mounting block 102. When the contact strips 104 are not contacted with electrical leads of an electronic component, they are generally arranged horizontally and flat.

During testing of an electronic component, electrical leads on the electronic component are made to press on the ends of the contact strips 104. After contact has been made between the contact strips 104 and electrical leads of the electronic component, the electronic component is driven further downwards so as to bend the contact strips 104 from their horizontal positions and to stress them. The required contact pressure is formed to ensure good contact once the flexible contact strips 104 have been bent by a certain predetermined distance.

A disadvantage of adopting this approach is that, in addition to positioning the electronic component next to the contact strips during testing, the electronic component has to be driven by a certain distance towards the contact strips at every testing cycle until the contact resistance between the electrical leads of the component and the contact strips is low enough to create good contact therebetween. The additional time taken to drive the electronic component further by a predetermined distance during the electrical test of every component significantly slows down the testing cycle.

U.S. Pat. No. 5,743,749 describes an electronic component connector in which terminals are formed on a measurement circuit board. Support members are provided on the measurement circuit board to correspond to the terminals, and the support members have free end portions with contacts to come into contact with the electrical lead terminals of electronic components for testing. These contacts are formed of separate members from the support members in order to increase the freedom in selecting the material of the contact which need not have elasticity. Thus, the performance of the electronic component connector can be improved by the selection of appropriate materials to reduce interference during high frequency testing. However, this approach still requires a relatively large travel stroke in order to create enough contact force to ensure good contact and to reduce contact resistance during electrical testing.

SUMMARY OF THE INVENTION

Thus, the invention seeks to provide an electrical test contactor system which serves to reduce the testing cycle time by avoiding the disadvantages associated with the aforesaid prior art.

Accordingly, the invention provides a testing apparatus for electronic components, comprising: a mounting block; a plurality of contact strips arranged on the mounting block and configured such that electrical leads of an electronic component are operative to press against and bend the contact strips in a biasing direction to ensure good contact between the electrical leads and the contact strips during testing of the electronic component; and a preload block located on the mounting block that is operative to contact and apply a pre-stress force onto the contact strips in the biasing direction prior to contact between the electrical leads and the contact strips.

It would be convenient hereinafter to describe the invention in greater detail by reference to the accompanying drawings which illustrate one preferred embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which.

DETAILED DESCRIPTION OF THE PREFERRED EMBODIMENT OF THE INVENTION

Figure 1:
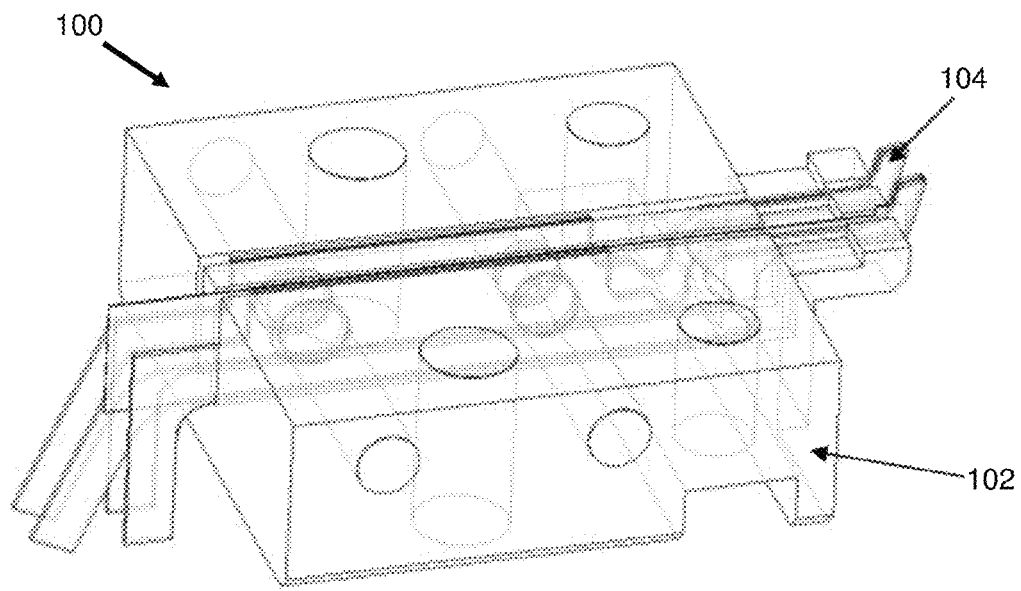
FIG. 1 is an isometric view of contact strips mounted on a mounting block in a prior art test contactor.
Figure 2:
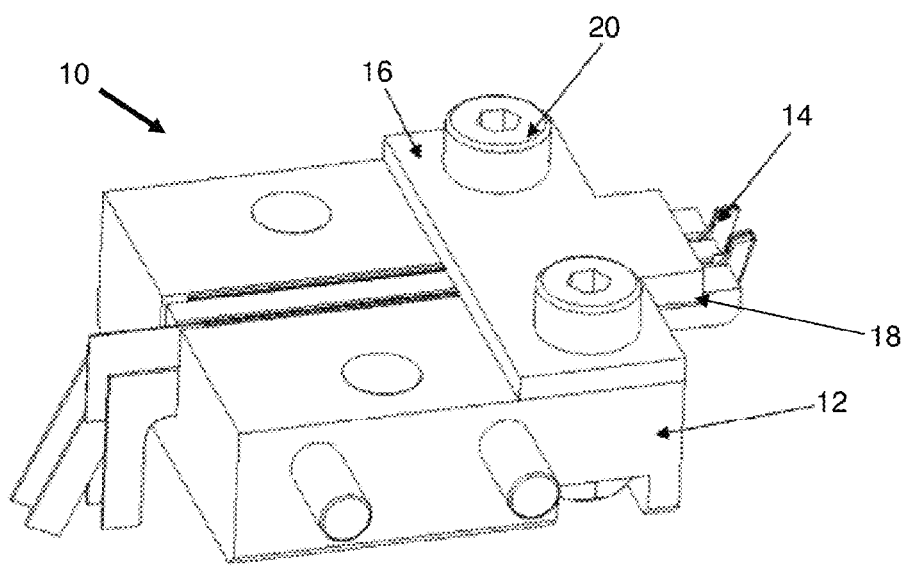
FIG. 2 is an isometric view of contact strips mounted on a mounting block in a test contactor according to the preferred embodiment of the invention.

FIG. 2 is an isometric view of contact strips 14 mounted on a mounting block 12 in a test contactor 10 according to the preferred embodiment of the invention. As in a conventional test contactor 100, the contact strips 14 comprise elongated strips of electrically-conductive material which are centrally attached and mounted to a mounting block 12. The plurality of contact strips 14 are arranged and configured such that electrical leads of an electronic component are operative to press against and bend the contact strips 14 in a biasing direction to ensure good contact between the electrical leads and the contact strips during testing of the electronic component. When the contact strips 14 are not contacted with the electrical leads of the electronic component, they are generally horizontal.

Additionally, a preload block 16 is located on the mounting block 12 on top of the contact strips 14. Preferably, the preload block 16 is detachably mounted on the mounting block 12. The preload block 16 has a biasing flange 18 which protrudes onto the contact strips 14 when the preload block 16 is attached onto the mounting block 12. The preload block 16 is secured onto the mounting block 16 by a fixing element, such as screws 20, such that the biasing flange 18 bends the contact strips 14 by exerting a pre-stress force onto the contact strips 14 in a biasing direction. This pre-stress force will serve to bend the contact strips in a biasing direction to slightly less than a required displacement for good contact with the electrical leads of an electronic component to be tested.

Figure 3:
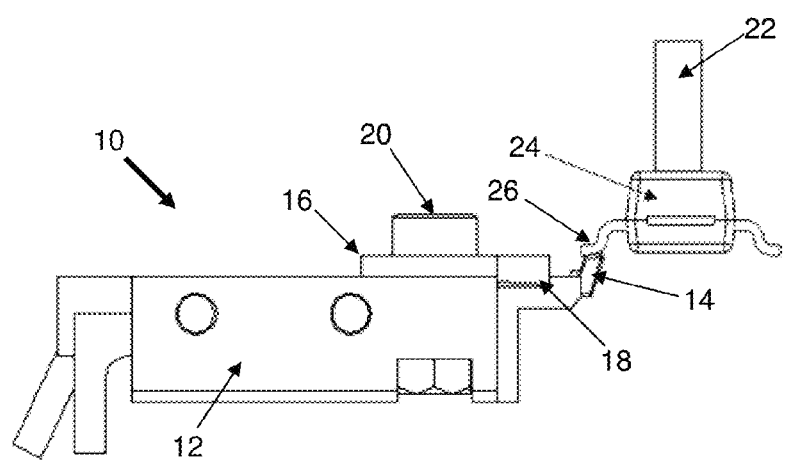
FIG. 3 is a side view of an electrical lead of an electronic component that is in electrical contact with a contact strip that has been pre-stressed according to the preferred embodiment of the invention during testing.

FIG. 3 is a side view of an electrical lead 26 of an electronic component 24 that is in electrical contact with a contact strip 14 that has been pre-stressed according to the preferred embodiment of the invention during testing. The electronic component 24 is being held by a collet 22 of a test handler and its electrical lead 26 is positioned onto the contract strip 14. As described above, the contact strip 14 has already been pre-stressed by the biasing flange 18 of the preload block 16.

Therefore, the collet 22 needs only to hold the electronic component 22 and provide a downward force for the electrical lead 26 to exert a sufficient contact force from the electrical lead 26 onto the contact strip 14. There is no requirement for the collet 22 to drive the electronic component 24 further downwards by as much a distance as in conventional test contactors 100 in order to provide a sufficient contact force between the electrical lead 26 and the contact strip 14 to ensure reliable testing. During a testing process, the additional downward travel of the electronic component 24 being tested will then be dramatically reduced to achieve a sufficient contact force for good contact, to as little as almost zero. This reduces the downward travel stroke and travel time of the collet 22.

It should be appreciated that the test contactor according to the preferred embodiment of the invention is operative to reduce the extra travel distance of the electronic component so as to shorten test cycle time. The testing throughput of the test contactor is thereby increased.

The invention described herein is susceptible to variations, modifications and/or additions other than those specifically described and it is to be understood that the invention includes all such variations, modifications and/or additions which fall within the spirit and scope of the above description.

The invention claimed is:

1. A testing apparatus for electronic components, comprising:
   a mounting block;
   a plurality of contact strips arranged on the mounting block and configured such that electrical leads of an electronic component are operative to press against and bend the contact strips in a biasing direction to ensure good contact between the electrical leads and the contact strips during testing of the electronic component; and
   a preload block located on the mounting block that is operative to contact and apply a pre-stress force onto each of the plurality of contact strips in the same biasing direction prior to contact between the electrical leads and the plurality of contact strips, such that the plurality of contact strips are bent in the same biasing direction.

2. The testing apparatus as claimed in claim 1, wherein the preload block is detachably mounted to the mounting block.

3. The testing apparatus as claimed in claim 2, further comprising a fixing element which is operative to attach the preload block to the mounting block.

4. The testing apparatus as claimed in claim 3, wherein the fixing element comprises screws.

5. The testing apparatus as claimed in claim 1, wherein the preload block further comprises a biasing flange which protrudes onto and bends one or more of the contact strips in the biasing direction.

6. The testing apparatus as claimed in claim 5, wherein the contact strips are bent by the biasing flange to slightly less than a required displacement for good contact between the contact strips and the electrical leads of the electronic component.

7. The testing apparatus as claimed in claim 1, wherein the contact strips are pre-stressed such that a distance that the contact strips have to be moved by the electrical leads of the electronic component to achieve a sufficient contact force for good contact is reduced as compared to when the contact strips are not prestressed.

\* \* \* \* \*